April 27, 1954 J. E. KREPPS 2,677,112

INDUCTANCE TUNING MECHANISM

Filed Jan. 13, 1951 2 Sheets-Sheet 1

INVENTOR

James E. Krepps

BY F. E. Browder

ATTORNEY

INVENTOR
James E. Krepps
BY
F. E. Browder
ATTORNEY

Patented Apr. 27, 1954

2,677,112

UNITED STATES PATENT OFFICE 2,677,112

INDUCTANCE TUNING MECHANISM

James E. Krepps, Bloomington, Ind., assignor to Westinghouse Electric Corporation, East Pittsburgh, Pa., a corporation of Pennsylvania Application January 13, 1951, Serial No. 205,895

14 Claims. (Cl. 336—131)

This invention relates to tuning units for high frequency receivers, and it relates more particularly to permeability tuning units for television receivers.

The most commonly used television tuners are of the superheterodyne type, and employ rotary channel selectors which actuate switches for connecting first one and then another of pre-tuned inductances in each tuned circuit. Such switching mechanisms are not only expensive, but their contacts are subjected to wear and corrosion, and are sources of noise and distortion. Another disadvantage of such prior tuners has been that their fine tuning controls have usually tuned only the oscillator stages so that where there are more than two tuned circuits, misalignment of all cannot be compensated for.

This invention provides a permeability tuner for a television receiver which has the advantages that no switch contacts are used for selecting channels, and that it is less expensive and more efficient than prior tuners.

In one embodiment of the invention, a frame having two end plates with a horizontal chassis pan extending substantially midway therebetween, has one set of four tubes with tuning coils thereon for a low frequency band extending below one side of the pan, and has another set of four tubes with tuning coils thereon for a high frequency band extending below the opposite side of the pan. Two flat face pulleys are attached to a common shaft extending between the upper ends of the end plates, and have attached thereto flexible metal straps. The ends of the straps have attached thereto tuning core supporting bars, one for each of the two sets of tuning coils. Tuning cores are attached to rods extending below the coil bars, in alignment with the interiors of the coils. The shaft to which the pulleys are attached has a circular segment of relatively large diameter attached thereto and extending therebelow, and which has its lower edge gripped between a pair of circular discs on the inner end of a tuning shaft which extends through one of the end plates. A cord is attached through a spring to the ends of the strap on the pulley adjacent the end plate through which the tuning shaft extends, and is threaded around the tuning shaft and around idler pulleys supported on the end plates below the tuning shaft. Another cord is attached through a spring to the ends of the other strap and is threaded around idler pulleys supported on the lower end of the other end plate.

A band selector shaft extends through the tuning shaft, and operates switches for connecting one or the other of the two sets of tuning coils into the circuit for reception in a high frequency or a low frequency band.

When the tuning shaft is rotated in one direction, the cores for one set of the tuning coils are moved inwardly into their coils, while the cores for the other set of tuning coils are moved outwardly from their coils. When the tuning shaft is rotated in the opposite direction, this action is reversed.

A feature of the invention is that the tuning cores move in straight lines perpendicular to their associated core bar, and coincidental with the axes of their associated tuning coils. The core bars remain parallel at every point along their travel. As a result, the cores move the same distance with respect to their coils so that the circuits of each set of tuning coils track throughout the range of adjudgment of the tuning shaft.

Another feature of the invention is that the circuit components for each set of coils may be located on the same side of the tuner chassis as their associated coils, thereby reducing lead lengths, and facilitating assembly and wiring.

Another feature of the invention is that all of the circuit components and the wiring thereof can be completed before the end plates and the core moving mechanism are attached to the tuner chassis. This not only provides ease of wiring and assembly, but enables the core moving mechanism to be removed for servicing without disturbing the alignment of the tuned circuits.

Another feature of the invention is that since the cores all move the same distances when the tuning knob is rotated, their circuits are automatically tracked.

Another feature of the invention is that since no detents are used for stopping motion of the tuning shaft at a selected channel, the tuning shaft can be rotated to one side or the other, of the dial channel marker for providing peak performance, and this without the need for a separate fine tuning mechanism.

Objects of the invention are to simplify, to improve the performance of, and to reduce the cost of, multiband, high frequency tuners.

Another object of the invention is to tune separate bands of frequencies with separate sets of permeability tuned coils.

Another object of the invention is to provide mechanism particularly suitable for moving the cores of a permeability tuner having separate sets of coils for separate bands of frequencies, into and out of their associated coils.

The invention will now be described with reference to the drawings, of which:

Figure 1:
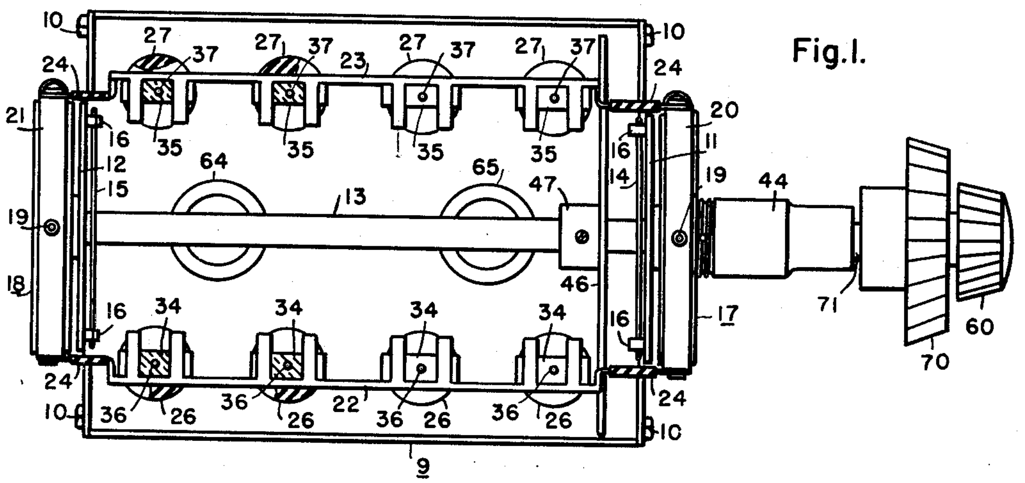
Fig. 1 is a plan view looking downwardly upon a television tuner embodying this invention.
Figure 2:
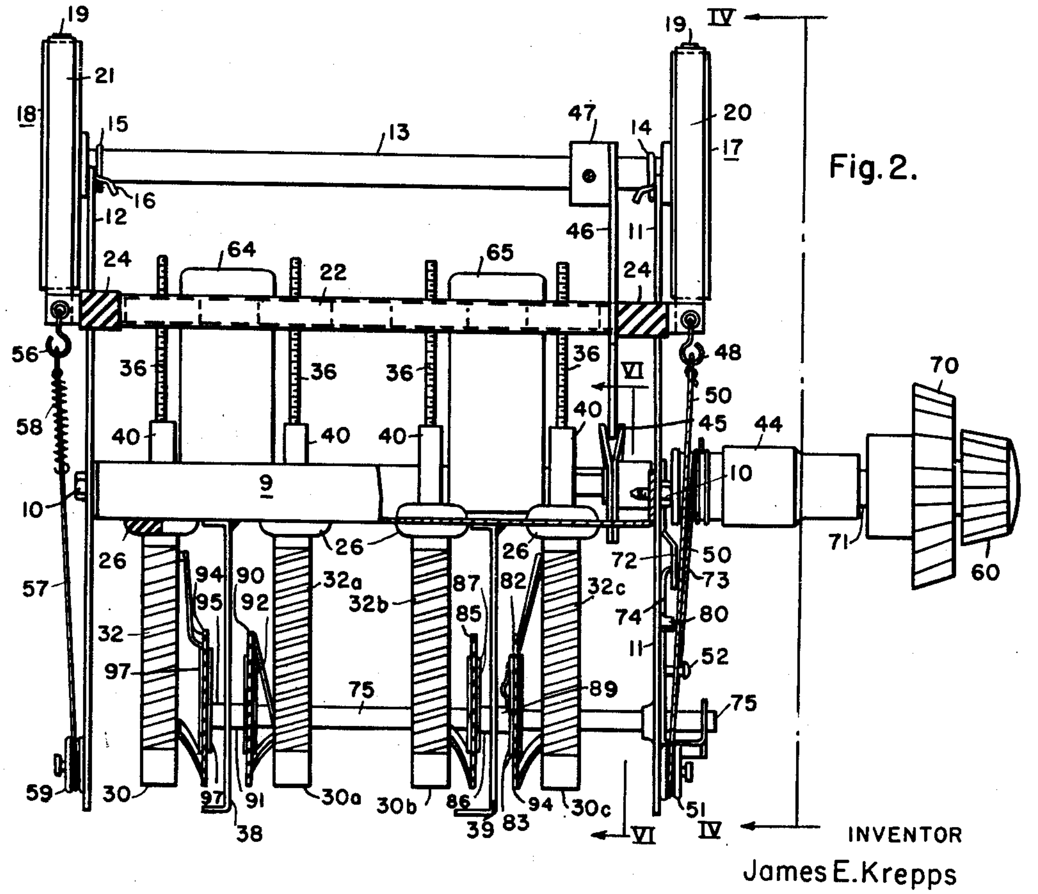
Fig. 2 is a side elevation of the tuner.
Figure 3:
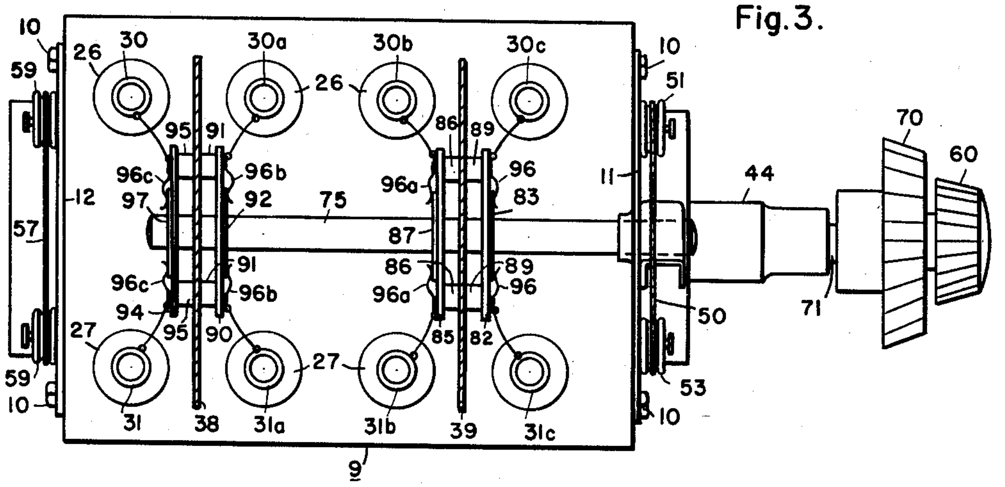
Fig. 3 is a plan view looking upwardly at the bottom of the tuner.

The horizontal chassis pan 9 has attached to its opposite ends, by the self-tapping screws 10, the vertical plates 11 and 12 which extend substantially the same distance above and below the pan. The rotary shaft 13 is seated in recesses in the upper ends of the plates 11 and 12, and is held therein and electrically grounded to the plates by the wires 14 and 15 of spring metal which have their ends under the lugs 16 on the plates and which are tensioned down over and in contact with the shaft.

The pulleys 17 and 18 are attached to the ends of the shaft 13 outside the space between the plates 11 and 12, and have attached thereto by the eyelets 19, the flexible metal straps 20 and 21.

The core bars 22 and 23 are attached to the ends of the straps 20 and 21 respectively, and have the sleeves 24 of electrical insulating material therearound adjacent the plates 11 and 12 for insulating the bars from the plates in case of contact.

The chassis pan has the spaced apart, rubber grommets 26 held in openings therein along one side thereof under the bar 22, and has the similar, spaced apart grommets 27 held in openings therein, along the opposite side thereof under the bar 23. The upper ends of the tubes 30, 30*a*, 30*b* and 30*c* of glass or other suitable electrical insulating material are force-fitted into the grommets 26 so as to support the tubes therefrom, and the upper ends of the similar tubes 31, 31*a*, 31*b* and 31*c* are force-fitted into the grommets 27 so as to support the tubes 31 therefrom.

The tubes 30, 30*a*, 30*b* and 30*c* have thereon the spirally wound coils 32, 32*a*, 32*b* and 32*c* respectively, each having a relatively large number of turns for tuning the 54–88 megacycle television band, and the tubes 31, 31*a*, 31*b* and 31*c* have thereon the spirally wound coils 33, 33*a*, 33*b* and 33*c* respectively, each having a relatively small number of turns for tuning the 174–216 megacycle band.

The metal shield plate 38 is attached at its upper end to the chassis pan, and extends vertically therebelow between the tubes 30 and 30*a*, and 31 and 31*a*. The similar shield plate 39 is attached at its upper end to the chassis pan and extends vertically therebelow between the tubes 30*b* and 30*c*, and 31*b* and 31*c*.

The spaced apart blocks 34 of glass or other suitable electrical insulating material are attached to the bar 22, centrally above the tubes 30, 30*a*, 30*b* and 30*c*, and the similar spaced apart blocks 35 are attached to the bar 23 centrally above the tubes 31, 31*a*, 31*b* and 31*c*. The upper ends of the core-supporting rods 36 are threaded in the blocks 34, and the upper ends of the similar rods 37 are threaded in the blocks 35.

The cylindrical, ferro-magnetic, cores 40 which may be of cemented, powdered iron, are attached to the lower ends of the threaded rods 36, and have slightly smaller diameters than the interiors of the tubes 30, 30*a*, 30*b* and 30*c* so that they are movable freely therein. The similar cores 41 are attached to the lower ends of the threaded rods 37, and have slightly smaller diameters than the interior diameters of the tubes 31*a*, 31*b* and 31*c*, so that they are movable freely therein.

The tuning shaft 44 is journalled in the end plate 11, and has mounted thereon adjacent its inner end, the pair of closely-spaced discs 45 of spring metal which grip therebetween the lower edge of the plate 46 which is formed as a circular segment attached to the hub 47 which is secured to the shaft 13.

The hooks 48 and 49 are attached to the ends of the strap 20. The core 50 is attached at one end to the hook 48 and is threaded over the idler pulley 51 and the pin 52 attached to the end plate 11, the shaft 44, and the idler pulley 53 attached to the end plate 11, and is attached at its other end to one end of the coil spring 54, the other end of which is attached to the hook 49.

The strap 21 has the hooks 56 attached to its ends and which are attached, one directly to the core 57, and the other through the coil spring 58 to the core 57 which is threaded over the idler pulleys 59 attached to the end plate 12.

When the tuning shaft 44 is rotated by the tuning knob 60 on its outer end, it rotates through the discs 45, the plate segment 46, which in turn rotates the shaft 13. Rotation of the shaft 13 causes rotation of the pulleys 17 and 18 which in turn move through the straps 20 and 21, the core supporting bars 22 and 23, one bar moving upwardly and the other moving downwardly, depending upon the direction of rotation of the tuning shaft.

When the bar 22 is moved downwardly, it moves the cores 40 further into the tubes 30, 30*a*, 30*b* and 30*c*, thus increasing the effective inductance of those coils. When the bar 22 is moved upwardly, it moves the cores 40 outwardly from the coils 32, 32*a*, 32*b* and 32*c*, thus decreasing the effective inductance of these coils.

Likewise when the bar 23 is moved downwardly, it moves the cores 41 further into the tubes 31, 31*a*, 31*b* and 31*c*, thus increasing the effective inductance of these coils. When the bar 23 is moved upwardly, it moves the cores 41 outwardly from the coils 33, 33*a*, 33*b* and 33*c*, thus decreasing their effective inductance.

The pulley 17 has a circular slot 62 therein into which the lug 61 from the plate 11 extends and which limits the movement of the pulley. When the lug 61 is at one end of the slot 62, one of the core bars will have been lifted to its extreme upper position while the other will have been lowered to its extreme lower position. When the lug 61 is at the other end of the slot 62, the other of the core bars will have been lifted to its extreme upper position while the one bar will have been lowered to its extreme lower position.

The coils 32, 32*a*, 32*b* and 32*c* may thus be made resonant at different frequencies in the 54–88 megacycle band, depending upon the position of the cores 40 relative thereto. The coil 32 may be the input coil for a radio frequency amplifier tube for the television channels 2–6. The coil 32*c* may be the oscillator tuning coil for the same channels, and the two intermediate coils 32*b* and 32*c* may be the plate tuning coil of the radio frequency amplifier, and the input coil for a modulator respectively, for the channels 2–6.

Likewise the coils 33, 33a, 33b and 33c may be made resonant at different frequencies in the 174–216 megacycle band, depending upon the positions of the cores 41 relative thereto. The coil 33 may be the input coil for the radio frequency amplifier tube for the channels 7–10, the coil 33c may be the oscillator tuning coil for the same channels, and the two intermediate coils 33b and 33c may be the plate tuning coil of the radio frequency amplifier and the input coil of the modulator respectively, for the channels 7–13.

A cylindrical metal shield 64 for a radio frequency amplifier tube is mounted on the chassis pan 9 above the shield plate 38, and a similar shield 65 for a tube serving as a combined modulator and oscillator is mounted on the chassis pan above the shield plate 39.

The spring tensioned cords 50 and 57 attached to the ends of the straps 20 and 21 respectively, cause the core supporting bars 22 and 23 respectively, to move parallel at all times to each other and to the shaft 13, so that the tuning cores 40 and 41 move the same distances throughout the entire range of adjustment, with respect to their associated coils. In addition, the cord 50, though being threaded around the tuning shaft, aids the action of the spring discs 45 and the segment 46 in the movement of the straps 20 and 21 when the tuning shaft is rotated.

The rods 36 to which the tuning cores 40 are attached, may be rotated in the associated blocks 34 into which they are threaded, for raising or lowering the cores individually, for causing the circuits they tune to track. Likewise the rods 37 to which the tuning cores 41 are attached, may be rotated in the associated blocks 35 into which they are threaded, for raising or lowering the cores 41 individually, for causing the circuits they tune to track.

For enabling the tuner to be tuned to channels 2–6 or alternately to channels 7–13, a switching mechanism is provided for connecting the coils 32, 32a, 32b and 32c to their associated circuits, and for disconnecting the coils 33, 33a, 33b and 33c from the same circuits when channels in the 2–6 channel band are to be selected, and for disconnecting the coils 32, 32a, 32b and 32c from their circuits and for connecting the coils 33, 33a, 33b and 33c thereto when channels in the 7–13 channel band are to be selected. This mechanism includes the knob 70 which is attached to the outer end of the band selector shaft 71 which is journalled within the tuning shaft 44, and which has attached to its inner end the upper switch arm 72 having forked outer ends which straddle an outwardly turned lug 73 on the upper end of the lower switch arm 74 which is attached to the rotary switch shaft 75 of electric insulating material which extends through, and is journalled for rotation in, the end plate 11 and the shield plates 38 and 39.

Figure 4:
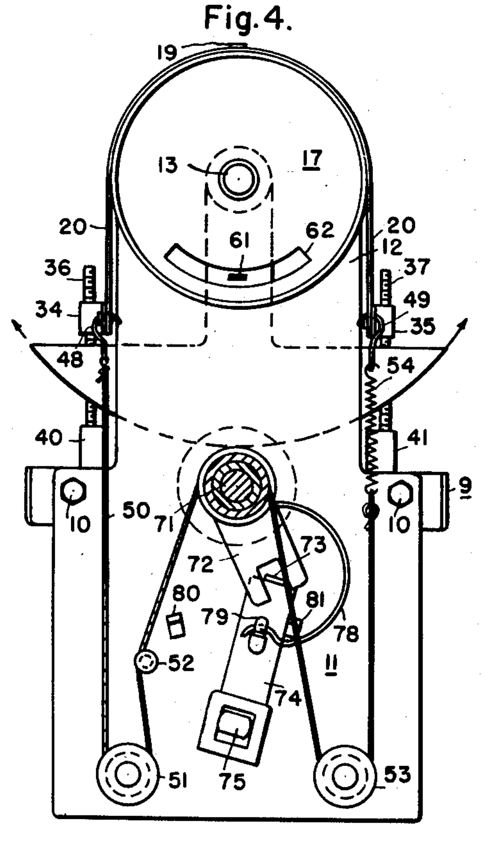
Fig. 4 is a sectional view along the lines IV—IV of Fig. 2.
Figure 5:
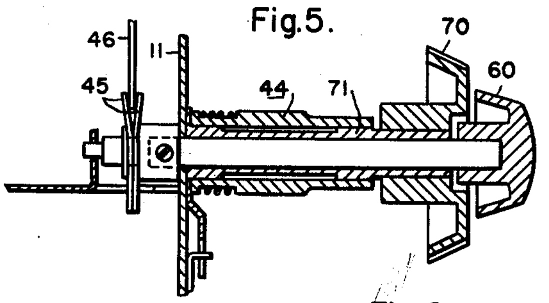
Fig. 5 is a sectional view along the lines V—V of Fig. 6.
Figure 6:
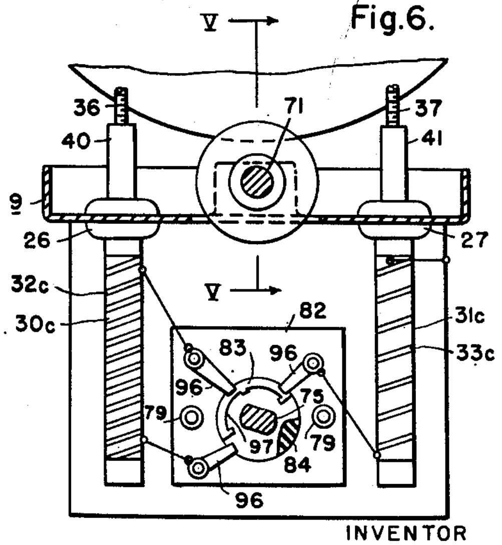
Fig. 6 is a sectional view along the lines VI—VI of Fig. 2.

The spring 78 has one end coiled around the shaft 71 and has its other end hooked around a lug 79 on the lower switch arm 74. It serves to kick the band switching shaft 75 and the mechanism it carries, from the 2–6 channel band position to the 7–13 channel band position when the band selector knob 60 is rotated counterclockwise with respect to Fig. 4 of the drawing, and to kick the band selecting shaft and the mechanism it carries from the 7–13 channel band position to the 2–6 channel band position when the band selector knob is rotated clockwise. The lugs 80 and 81 which extend outwardly from the end plate 11, on the opposite sides of the upper switch arm 74, limit its motion when switching from one band to another.

A switch wafer 82 of insulating material is attached through the spacers 89 to the innermost side of the shield plate 39 and has wiping contacts 96 thereon which contact the metal segments 83 on a circular disc 84 of insulating material attached at its center to the shaft 75 and rotated within a circular opening in the center of the wafer. The metal segment and the wiping contacts serve to connect the coil 32c on the tube 30c in the input circuit of the associated radio frequency amplifier tube when the band switching knob 60 is rotated to the 2–6 channel position at which time the coil 33c on the tube 31c is disconnected from that circuit, and serve to connect the coil 33c in the input circuit of the radio frequency amplifier tube when the band switching knob is rotated to the 7–13 channel position at which time the coil 32a is disconnected from that circuit.

Other wiping contacts would be used, but for convenience of illustration have been omitted. This also applies to the wafers for the other tuned circuits which will be described in the following.

A similar switch wafer 85 is attached through the spacers 86 to the outer side of the shield plate 39 and has wiping contacts 96a thereon which contact the metal segments 87 on a circular disc of insulating material attached at its center to the shaft 75 and rotated within a circular opening in the center of the wafer 85. The metal segment and the wiping contacts serve to connect the coil 32b in the plate circuit of the radio frequency amplifier tube when the band switching knob is rotated to the 2–6 channel position, at which time the coil 33b is disconnected from that circuit, and serve to connect the coil 33b in the plate circuit of the radio frequency amplifier tube when the band switching knob is rotated to the 7–13 channel position, at which time the coil 32b is disconnected from that circuit.

A similar wafer 90 is attached through the spacers 91 to the shield plate 38 and has wiping contacts 96b which contact the metal segments 92 on a circular disc of insulating material attached at its center to the shaft 75 and rotated within a circular opening in the center of the wafer 90. The metal segments and the contacts serve to connect the coil 32a in the input circuit of the modulator tube when the band switching knob 70 is rotated to the 2–6 channel position at which time the coil 33a is disconnected from that circuit, and serve to connect the coil 33a in the input circuit to the modulator tube when the band selector knob is rotated to the 7–13 channel position at which time the coil 32a is disconnected from that circuit.

A similar switch wafer 94 is attached through the spacers 95 to the outermost side of the shield plate 38, and has wiping contacts 96c thereon which contact the metal segments 97 on the opposite sides of a circular disc of insulating material which is attached at its center to the shaft 75 and rotated within a circular opening in the wafer 94. The contacts and segments serve to connect the coil 32 in the oscillator circuit when the band switching knob is rotated to the 2–6 channel position at which time the coil 33 is disconnected from that circuit, and serve to connect the coil 33 in the oscillator circuit when the band selector switch is rotated to the 7–13 channel position, at which time the coil 32 is disconnected from that circuit.

In operation, if it is desired to tune the tuner to a channel in the 2–6 channel band, the operator first rotates the band selector knob counter-clockwise, thus connecting the coils 32, 32*a*, 32*b* and 32*c* in the input, radio frequency tube plate, modulator and oscillator circuits respectively, and disconnecting the coils 33, 33*a*, 33*b* and 33*c* from such circuits. Then upon rotation of the tuning knob 60, the channels in the 2–6 channel band will be tuned in, rotation of the knob 60 clockwise causing the tuning cores 40 to move further into the coils 32, 32*a*, 32*b* and 32*c*, and causing the tuned circuits to become resonant at lower frequencies so as to tune in the lower channels. Likewise, counter-clockwise rotation of the knob 60 will cause the cores 40 to move outwardly from the coils 32, 32*a*, 32*b* and 32*c*, causing the tuned circuits to become resonant at higher frequencies and to tune to higher frequency stations.

If it is desired to tune to a channel in the 7–13 channel band, the band selector knob is rotated clockwise for connecting the coils 33, 33*a*, 33*b* and 33*c* in the tuned circuits, and disconnecting the coils 32, 32*a*, 32*b* and 32*c* therefrom. Then upon rotation of the tuning knob 60, the channels in the 7–13 channel band will be tuned in, clockwise rotation of the knob 60 causing the tuning cores 41 to move outwardly from the coils 33, 33*a*, 33*b* and 33*c*, causing the tuned circuits to become resonant at higher frequencies so as to tune in higher frequency channels in the 7–13 channel band. Likewise rotation of the knob 60 in a counter-clockwise direction will cause the cores 41 to move further into the coils 33, 33*a*, 33*b* and 33*c*, causing the tuned circuits to become resonant at lower frequencies and to be tuned to the lower frequencies channels.

A suitable dial may be provided for indicating when different channels are selected. Since the tuning shaft will not be halted by detents at channel positions as is usual in television tuners, by rotation of the tuning knob slightly past a channel marker first in one direction and then in the other direction, fine tuning adjustment of all four tuned circuits will be provided for peaking all circuits, this resulting in a stronger signal than is provided by television tuners in which the fine tuning adjustments are provided by capacitors in the oscillator circuits, and which can be adjusted to cause an oscillator circuit to track with only one of the other tuned circuits.

Since the two sets of tuning coils are mounted on opposite sides of the chassis pan with the band switching mechanism therebetween, components such as capacitors and resistors associated with each set of coils may be mounted on the same side of the chassis pan as their associated coils, thus reducing lead lengths. All wiring may be completed before the end plates 11 and 12 and the core moving mechanism are assembled, this providing ease of assembly and wiring of the electrical components. It is also possible easily to remove and reassemble the complete core moving mechanism from the chassis pan without disturbing alignment of the tuned circuits, in case servicing is necessary, this being accomplished by removal of the four screws 10, the withdrawal of the shaft 44 and the lifting of the entire mechanism from the chassis pan.

While a tuner has been illustrated and described as having coil supporting tubes extending below a chassis pan, the invention is not limited to that arrangement since the tuner would function as well if inverted or placed in other positions.

I claim as my invention:

1. A tuning unit comprising a frame, a coil support extending horizontally across said frame, a first plurality of spaced, aligned tubes extending from said support along one side thereof, a second plurality of spaced, aligned tubes extending from said support along the other side thereof, said first and second tubes having parallel axes, a first plurality of coils on said first tubes, a second plurality of coils on said second tubes, a first plurality of tuning cores aligned centrally with said first tubes, a second plurality of tuning cores aligned centrally with said second tubes, a first core supporting means attached to said first cores and extending perpendicular to the axis of said tubes, a second core supporting means attached to said second cores and extending perpendicular to the axes of said tubes, and means for moving said first core supporting means towards said first tubes and for simultaneously moving said second core supporting means away from said second tubes.

2. A tuning unit comprising parallel end plates, a chassis pan supported between said plates and substantially perpendicular thereto, said pan having a first plurality of spaced, aligned openings therein along one side thereof, and having a second plurality of spaced, aligned openings thereon along the opposite side thereof, a first plurality of tubes aligned with said first openings and supported to one side of said pan substantially perpendicular thereto, a second plurality of tubes aligned with said second openings and supported to said one side of said pan, a first plurality of coils on said first tubes, a second plurality of coils on said second tubes, a first plurality of cores movable in said first tubes, a second plurality of cores movable in said second tubes, a first core supporting bar on the other side of said pan extending perpendicular to the axes of said first tubes and aligned therewith, a second core supporting bar on said other side of said pan extending perpendicular to the axes of said second tubes and aligned therewith and attached to said second cores, rods extending through said openings and connected to said bars and cores, and means for moving said first bar towards said first tubes, and for simultaneously moving said second bar away from said second tubes.

3. A tuning unit comprising parallel end plates, a chassis pan supported between said plates and substantially perpendicular thereto, said pan having a first plurality of spaced, aligned openings therein along one side thereof, and having a second plurality of spaced, aligned openings therein along the opposite side thereof, a first plurality of tubes aligned with said first openings and supported to one side of said pan substantially perpendicular thereto, a second plurality of tubes aligned with said second openings and supported to said one side of said pan, substantially perpendicular thereto, a first plurality of coils on said first tubes, a second plurality of coils on said second tubes, a second plurality of cores movable in said second tubes, a first core supporting bar on the other side of said pan extending perpendicular to the axes of said first tubes and aligned therewith and attached to said first cores, a second core supporting bar on the other side of said pan extending perpendicular to the axis of said second tubes and aligned therewith and attached to said second cores, rods extending through said openings and connected to said bars and cores, a rotary shaft extending between said plates at said other side of said chassis, a pair of spaced pulleys having cylindrical surfaces attached to said shaft, a pair of straps contacting said pulleys and having their ends attached to said bars, and means for rotating said shaft.

4. A tuner as claimed in claim 3 in which the means for rotating the shaft includes a tuning shaft journalled in one of said plates.

5. A tuner as claimed in claim 4 in which idler pulleys are provided on the end plates, and spring tensioned cords are attached to the ends of the straps and threaded over the idler pulleys.

6. A tuner as claimed in claim 5 in which one of the spring tensioned cords is threaded around the tuning shaft.

7. A tuner as claimed in claim 3 in which the means for rotating the shaft includes a plate shaped as a circular segment attached thereto and includes a tuning shaft having means thereon for gripping the edge of said segment.

8. A tuner as claimed in claim 3 in which the first coils are for tuning one band of frequencies and the second coils are for tuning another band of frequencies; in which there are circuit connections for the coils; in which the means for rotating the shaft includes a tuning shaft journalled in one of the end plates; in which a rotary band selector shaft extends through the tuning shaft, and in which means operated by said band selector shaft connects the first coils in the circuit connection when rotated in one direction, and connects the second coils to the circuit connections when rotated in the opposite direction.

9. A tuner as claimed in claim 8 in which the first-mentioned shaft has a plate shaped as a circular segment attached thereto and in which the tuning shaft has means thereon for gripping an edge of the segment.

10. A tuner as claimed in claim 8 in which idler pulleys are provided on said end plates, and spring tensioned cords are attached to the ends of the straps and threaded over the idler pulleys.

11. A tuner as claimed in claim 9 in which one of the spring tensioned cords is threaded over the tuning shaft.

12. A tuner as claimed in claim 10 in which one of the spring tensioned cords is threaded over the tuning shaft.

13. A tuner as claimed in claim 3 in which idler pulleys are provided on said end plates, and spring tensioned cords are attached to the ends of the straps and threaded over the idler pulleys.

14. A tuning unit comprising a frame, a coil support attached to said frame, a first plurality of spaced, aligned coils extending from said support along one side thereof, a second plurality of spaced, aligned coils extending from said support along the other side thereof, said first and second coils having parallel axes, a first plurality of tuning cores aligned centrally with said first coils, a second plurality of tuning cores aligned centrally with said second coils, a first core supporting means attached to said first cores and extending perpendicular to the axis of said coils, a second core supporting means attached to said second cores and extending perpendicular to the axes of said coils, and means for moving said first core supporting means toward said first coils and for simultaneously moving said second core supporting means away from said second coils.

References Cited in the file of this patent

UNITED STATES PATENTS

| Number | Name | Date |
|---|---|---|
| 377,217 | Thomson | Jan. 31, 1888 |
| 2,051,012 | Schaper | Aug. 11, 1936 |
| 2,230,946 | Hansell | Feb. 4, 1941 |

FOREIGN PATENTS

| Number | Country | Date |
|---|---|---|
| 616,240 | Great Britain | Jan. 18, 1949 |